US011758710B2

(12) United States Patent
Jhan et al.

(10) Patent No.: US 11,758,710 B2
(45) Date of Patent: Sep. 12, 2023

(54) MEMORY DEVICE AND FABRICATION METHOD THEREOF

(71) Applicant: Fujian Jinhua Integrated Circuit Co., Ltd., Quanzhou (CN)

(72) Inventors: Yi-Wang Jhan, Taichung (TW); Yu-Cheng Tung, Kaohsiung (TW); Fu-Che Lee, Taichung (TW); Chien-Cheng Tsai, Kaohsiung (TW); An-Chi Liu, Tainan (TW); Ming-Feng Kuo, Tainan (TW); Gang-Yi Lin, Taitung County (TW); Junyi Zheng, Shamen (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 157 days.

(21) Appl. No.: 17/405,002

(22) Filed: Aug. 17, 2021

(65) Prior Publication Data
US 2022/0139922 A1 May 5, 2022

(30) Foreign Application Priority Data

Nov. 3, 2020 (CN) .......................... 202011211530.2

(51) Int. Cl.
*H10B 12/00* (2023.01)

(52) U.S. Cl.
CPC ....... *H10B 12/315* (2023.02); *H10B 12/0335* (2023.02)

(58) Field of Classification Search
CPC .......................... H10B 12/315; H10B 12/0335; H10B 12/033; H10B 12/30; H10B 12/03; H01L 28/90
See application file for complete search history.

(56) References Cited

U.S. PATENT DOCUMENTS

2014/0138794 A1* 5/2014 Yang ........................ H01L 28/87
257/532
2015/0214289 A1* 7/2015 Kim ....................... H10B 12/315
438/387

* cited by examiner

*Primary Examiner* — David Vu
(74) *Attorney, Agent, or Firm* — Winston Hsu

(57) ABSTRACT

A memory device includes a first electrode, a first support layer, a dielectric layer and a second electrode. The first electrode is disposed on a substrate and extending upwards. The first support layer laterally supports an upper portion of a sidewall of the first electrode, where the first support layer has a slim portion. The dielectric layer is disposed on the first electrode and the first support layer. The second electrode is disposed on the dielectric layer. In addition, a method of fabricating the memory device is provided.

20 Claims, 13 Drawing Sheets

MEMORY DEVICE AND FABRICATION METHOD THEREOF

CROSS REFERENCE TO RELATED APPLICATION

This application claims the benefit of Chinese Patent Application Serial No. 202011211530.2, filed on Nov. 3, 2020, the entire content of which is incorporated herein by reference.

BACKGROUND OF THE INVENTION

1. Field of the Invention

The present disclosure relates generally to the field of semiconductor manufacturing technology, and more particularly to memory devices and methods of fabricating the same.

2. Description of the Prior Art

Dynamic random access memory (DRAM) is a kind of volatile memory which is an indispensable key component in many electronic products. DRAM which is arranged from a large number of memory cells to form an array area configured to store data. Each memory cell may consist of a metal oxide semiconductor (MOS) transistor and a capacitor connected in series.

The density of the memory cells in the array area has to be increased for the product demands, and the difficulty and the complexity of the related processes and design become higher accordingly. For instance, the area occupied by the capacitor structure in the memory cell becomes smaller relatively when the density of the memory cells increases. The capacitor structure has to extend upwards for increasing the area of the electrode in the capacitor structure because of the demand for a specific capacitance. However, it is very difficult to form an electrode layer having an extremely high aspect ratio when the height of the capacitor structure increases. A support layer is needed to support the electrode layer, but the existing support layer is prone to current leakage, resulting in the performance of the DRAM cannot be improved.

SUMMARY OF THE INVENTION

In view of this, it is necessary to provide memory devices and fabrication methods thereof to overcome the current leakage of the existing support layer and to improve the performance of the memory devices.

According to an embodiment of the present disclosure, a memory device is provided and includes a first electrode, a first support layer, a dielectric layer and a second electrode. The first electrode is disposed on a substrate and extending upwards. The first support layer laterally supports an upper portion of a sidewall of the first electrode, where the first support layer has a slim portion. The dielectric layer is disposed on the first electrode and the first support layer. The second electrode is disposed on the dielectric layer.

According to an embodiment of the present disclosure, a method of fabricating a memory device is provided and includes the following steps. A first electrode is formed on a substrate and extending upwards. A first support layer is formed to laterally support an upper portion of a sidewall of the first electrode, where the first support layer has a slim portion. A dielectric layer is formed on the first electrode and the first support layer. In addition, a second electrode is formed on the dielectric layer.

According to the embodiments of the present disclosure, the first support layer may reduce or avoid current leakage and ensure the supporting effect for the first electrode of a capacitor structure of the memory devices, thereby improving the performance of the memory devices.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2K is a schematic cross-sectional diagram of the memory device according to one embodiment of the disclosure.

DETAILED DESCRIPTION

Figure 1:
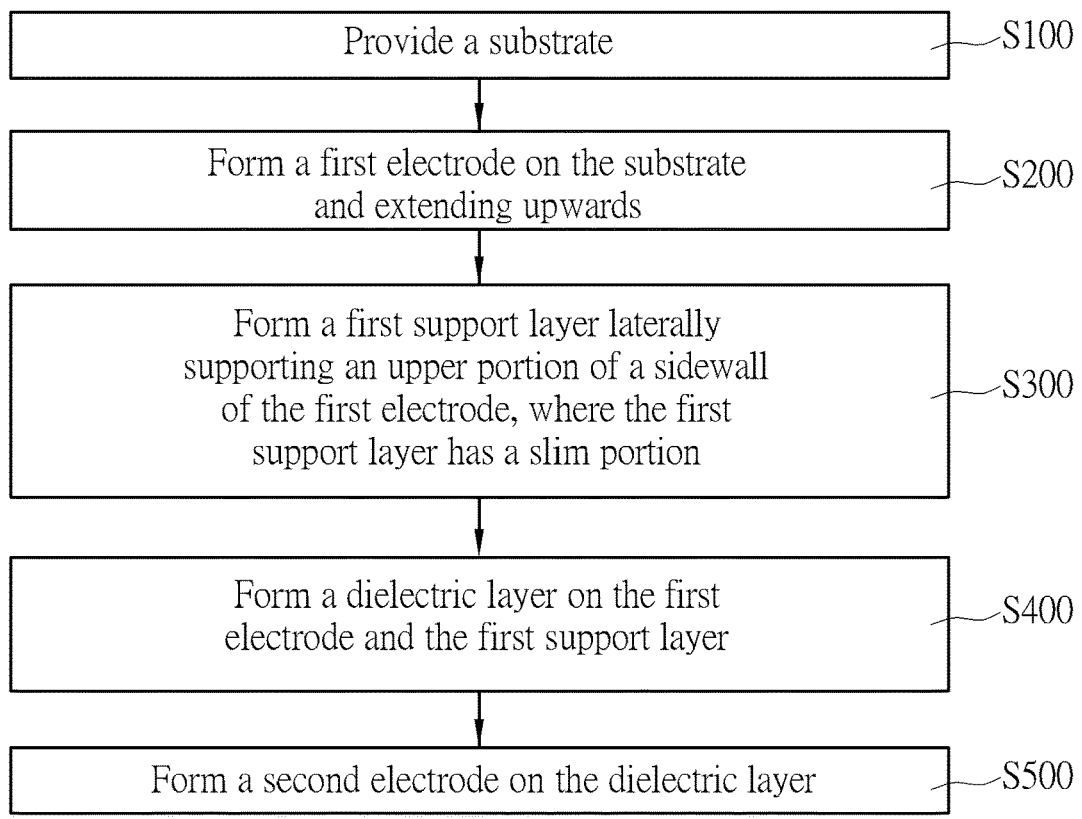
FIG. 1 is a flowchart illustrating a method of fabricating a memory device according to one embodiment of the disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed indirect contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

Although the disclosure is described with respect to specific embodiments, the principles of the invention, as defined by the claims appended herein, can obviously be applied beyond the specifically described embodiments of the invention described herein. Moreover, in the description of the present disclosure, certain details have been left out in order to not obscure the inventive aspects of the disclosure. The details left out are within the knowledge of a person having ordinary skill in the art.

Figure 2A:
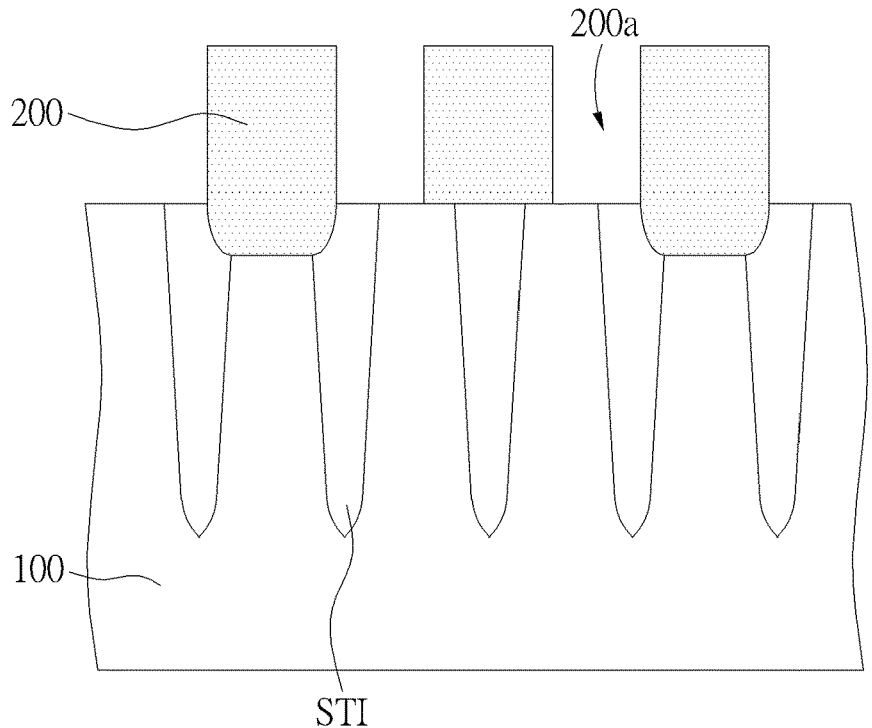
FIGS. 2A, 2B, 2C, 2D, 2E, 2F, 2G, 2H, 2I, 2J and 2K are schematic cross-sectional diagrams of fabricating a memory device according to one embodiment of the disclosure, where
Figure 2B:
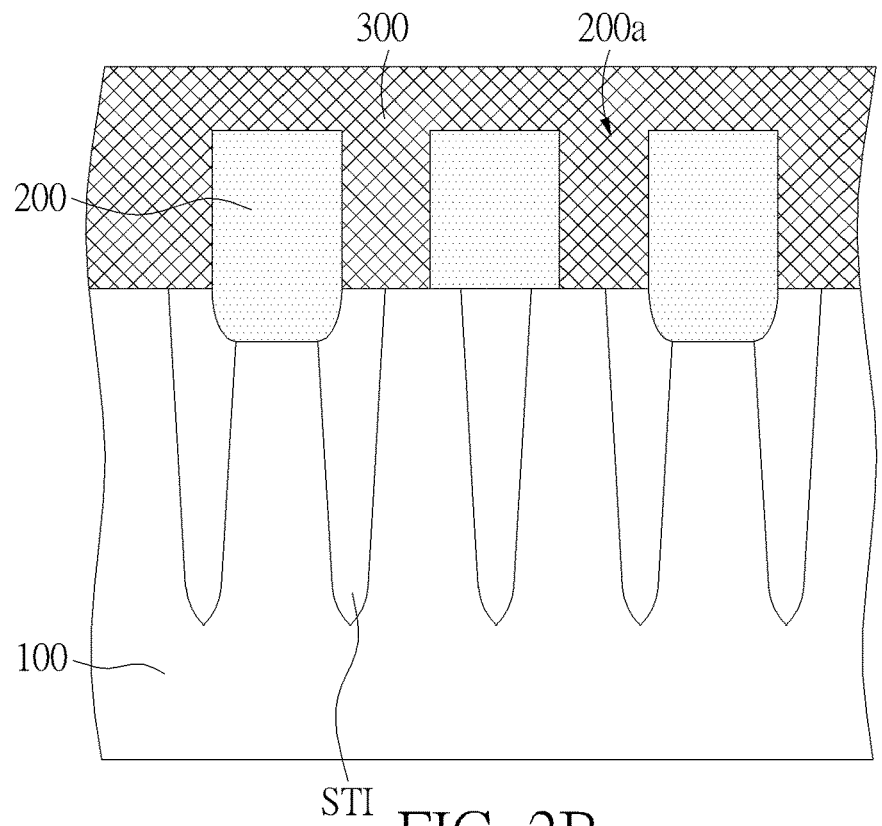
Figure 2C:
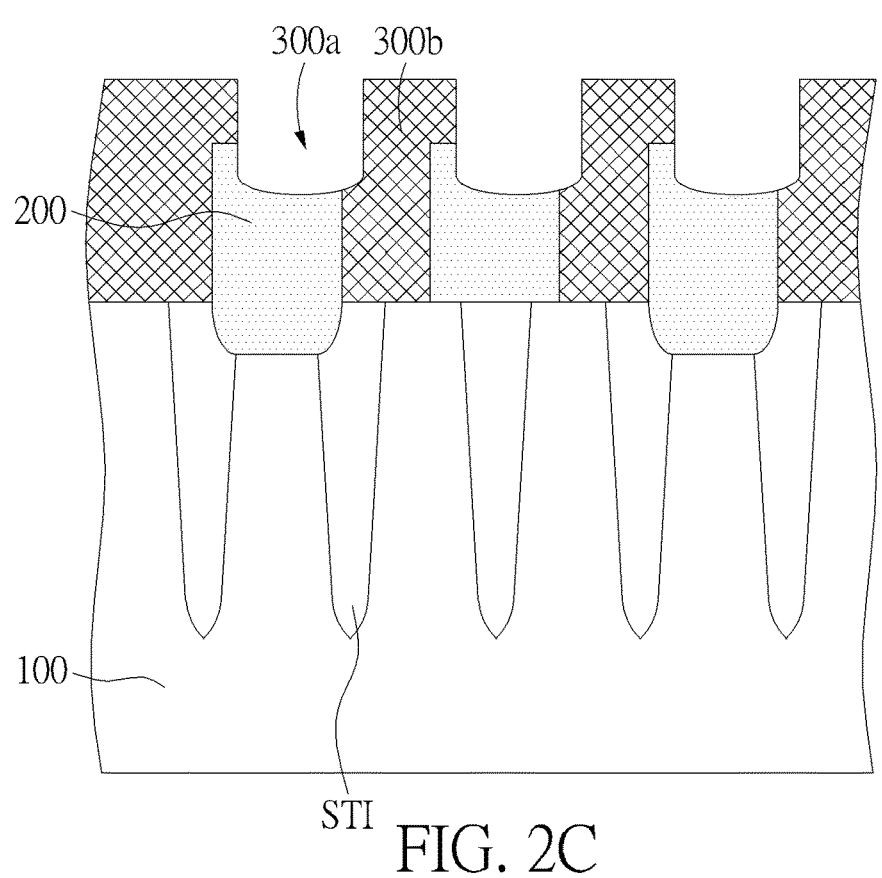
Figure 2D:
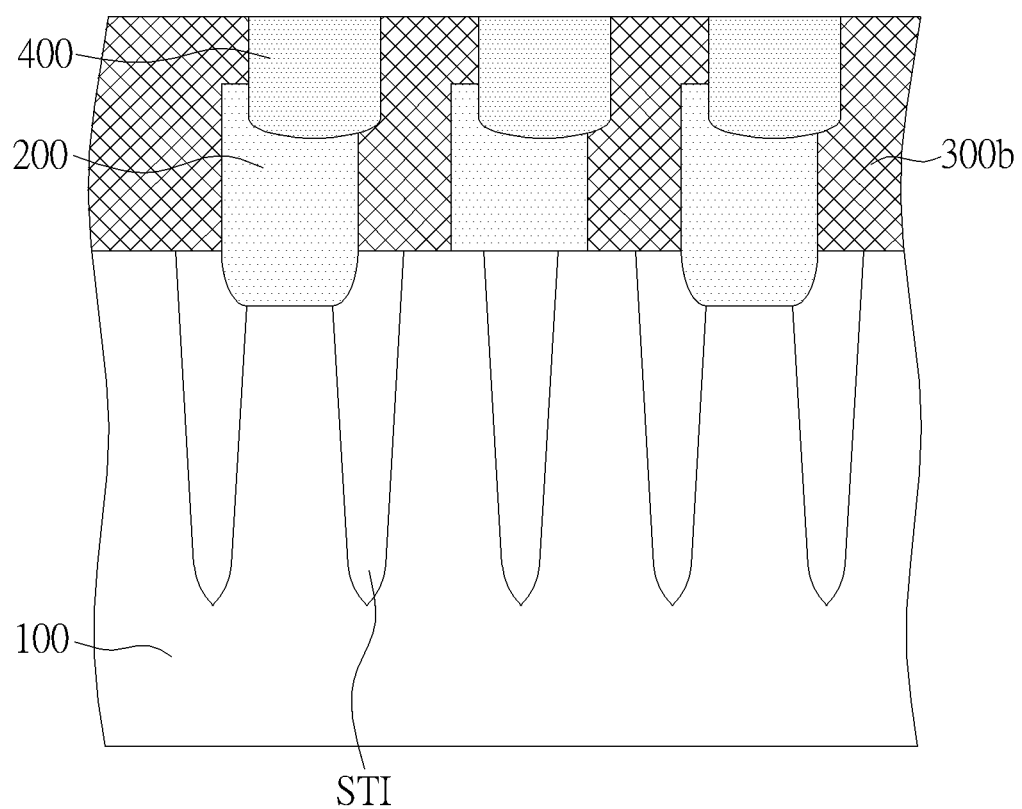
Figure 2E:
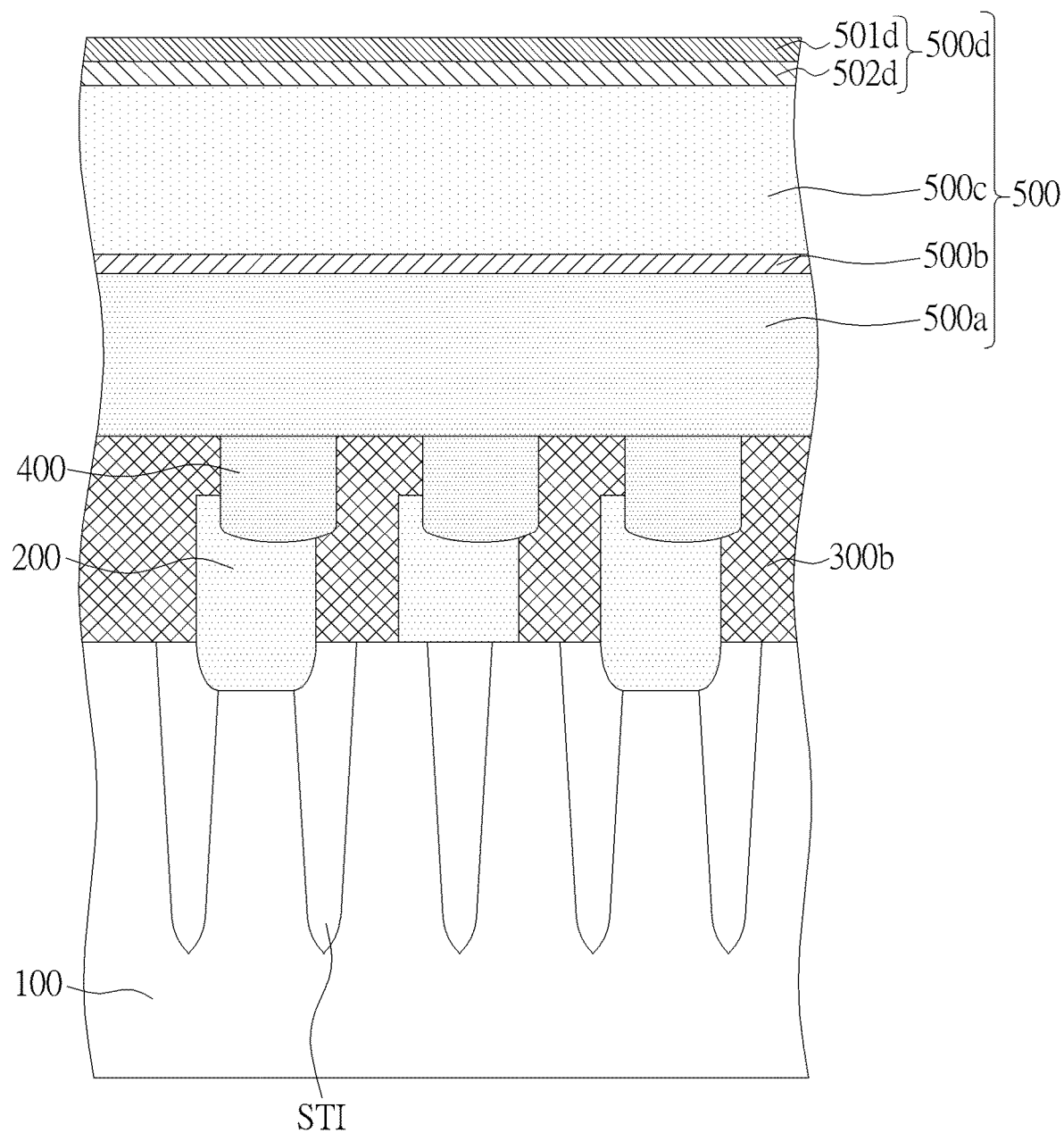
Figure 2F:
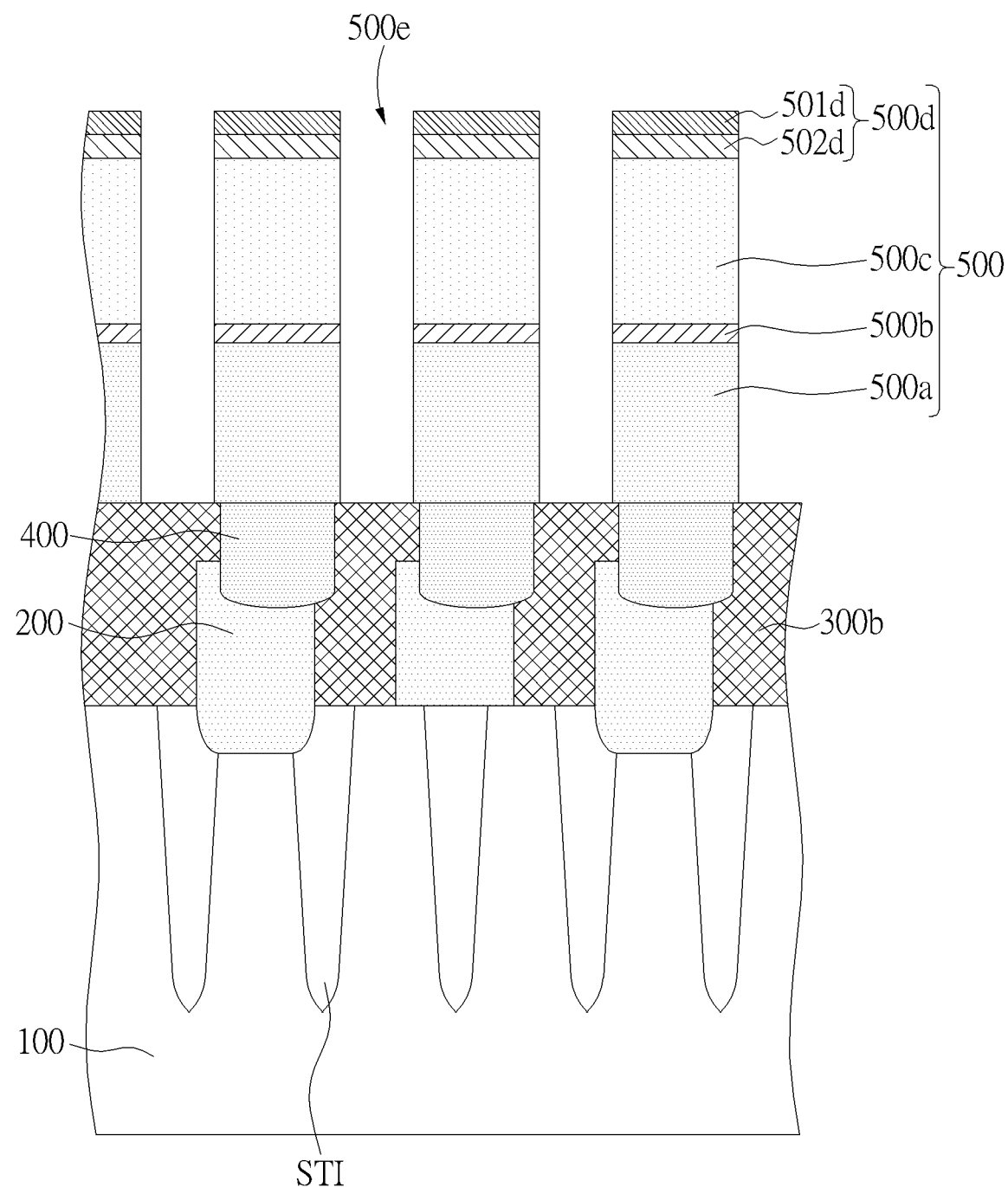
Figure 2G:
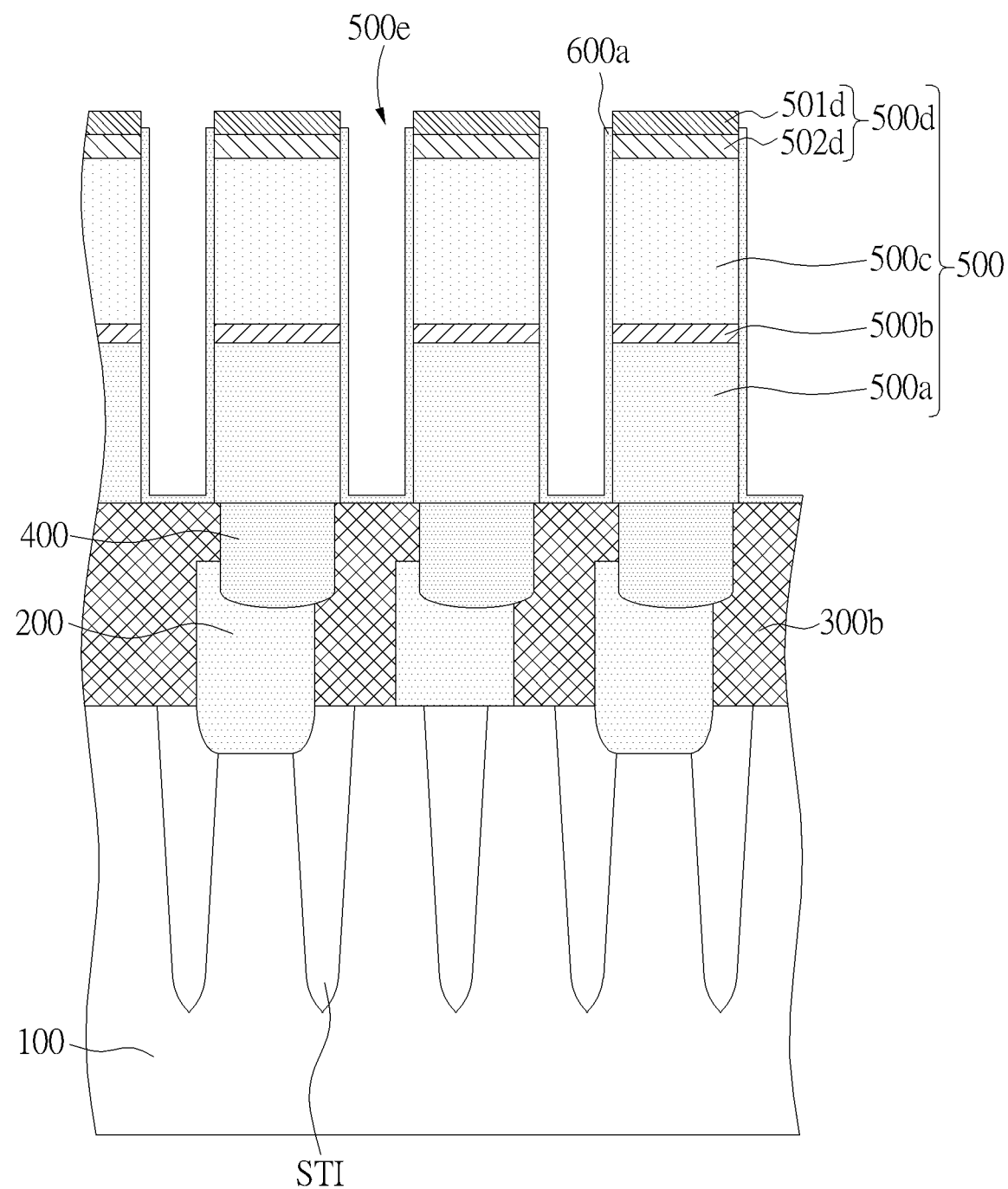
Figure 2H:
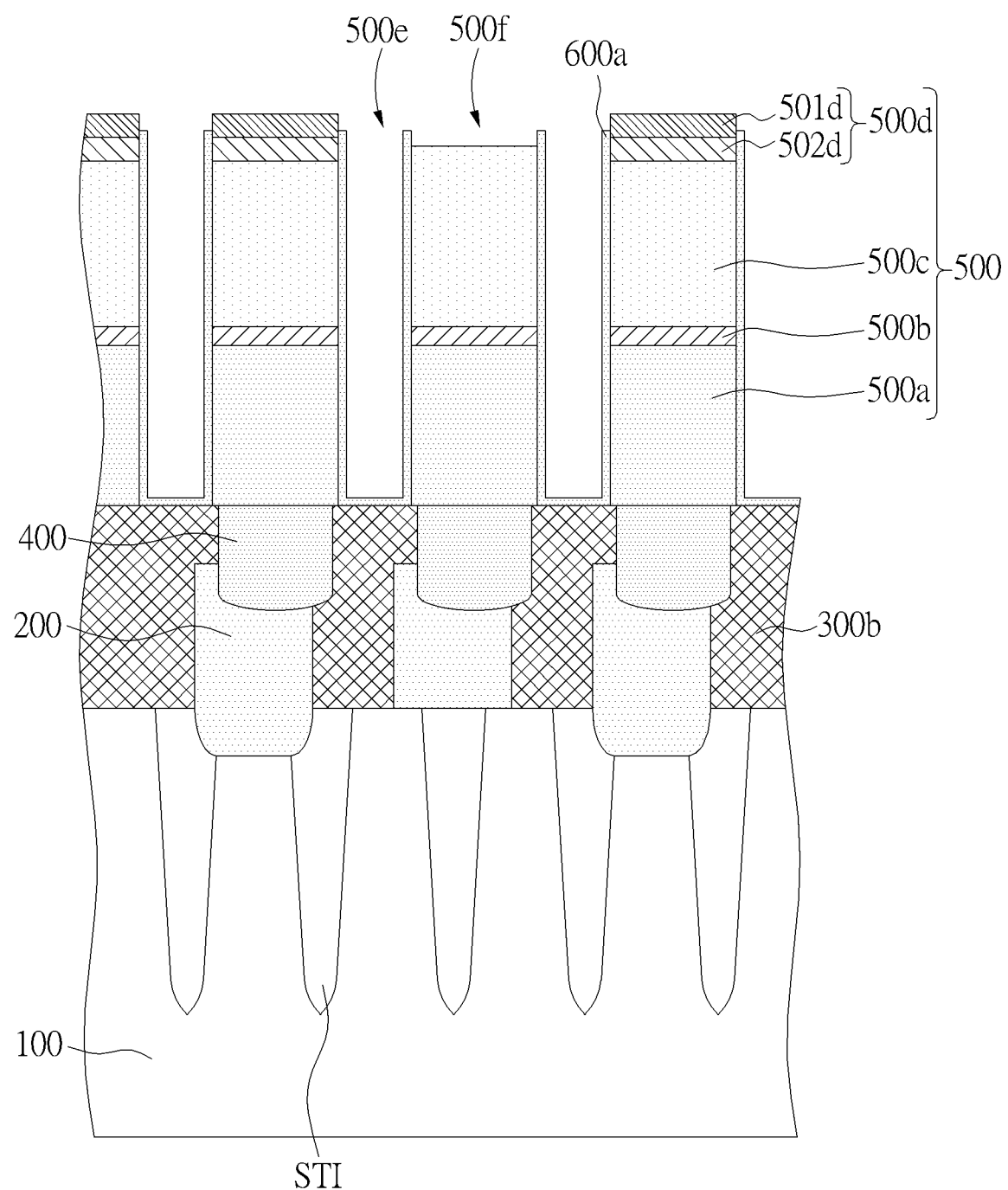
Figure 2I:
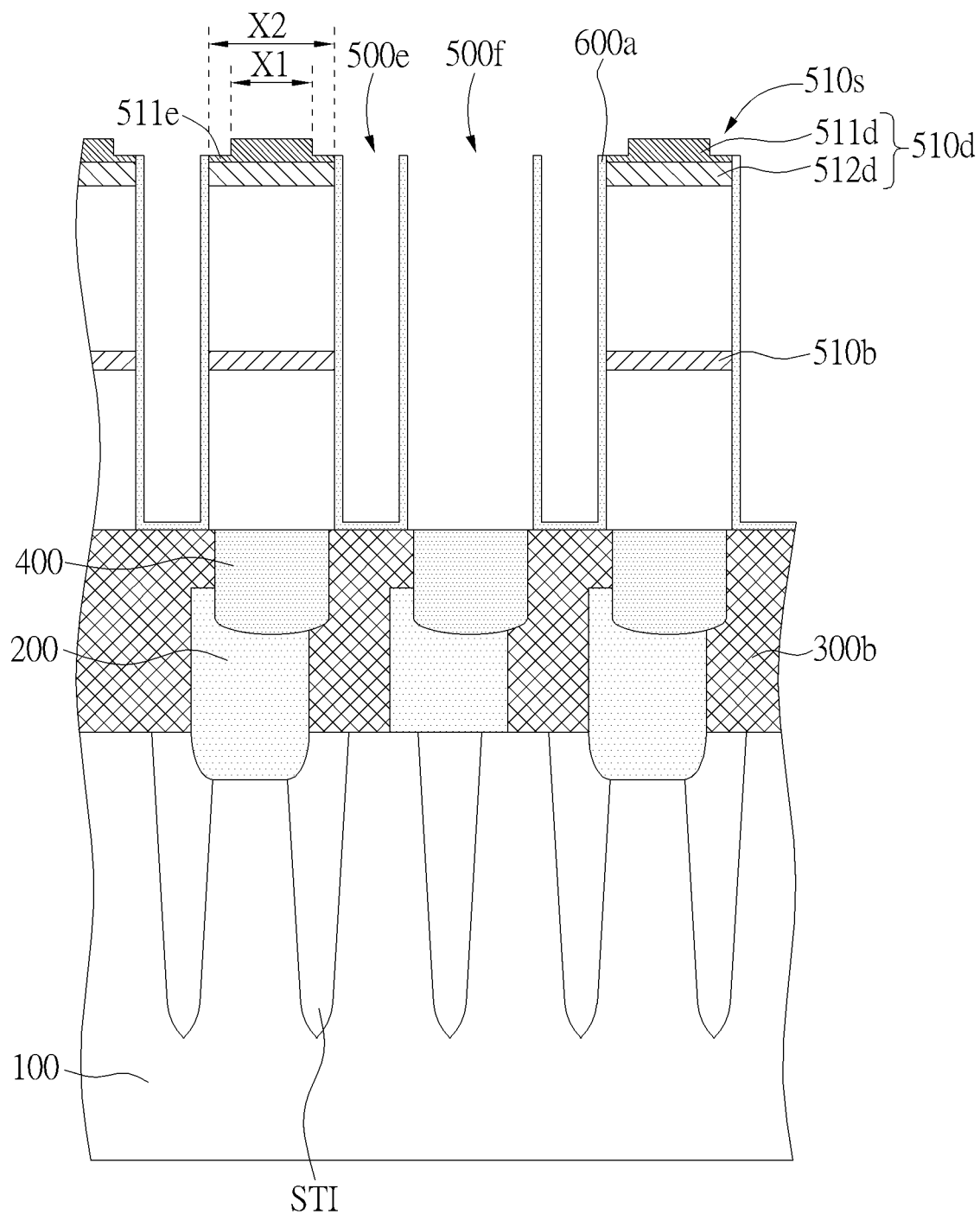
Figure 2J:
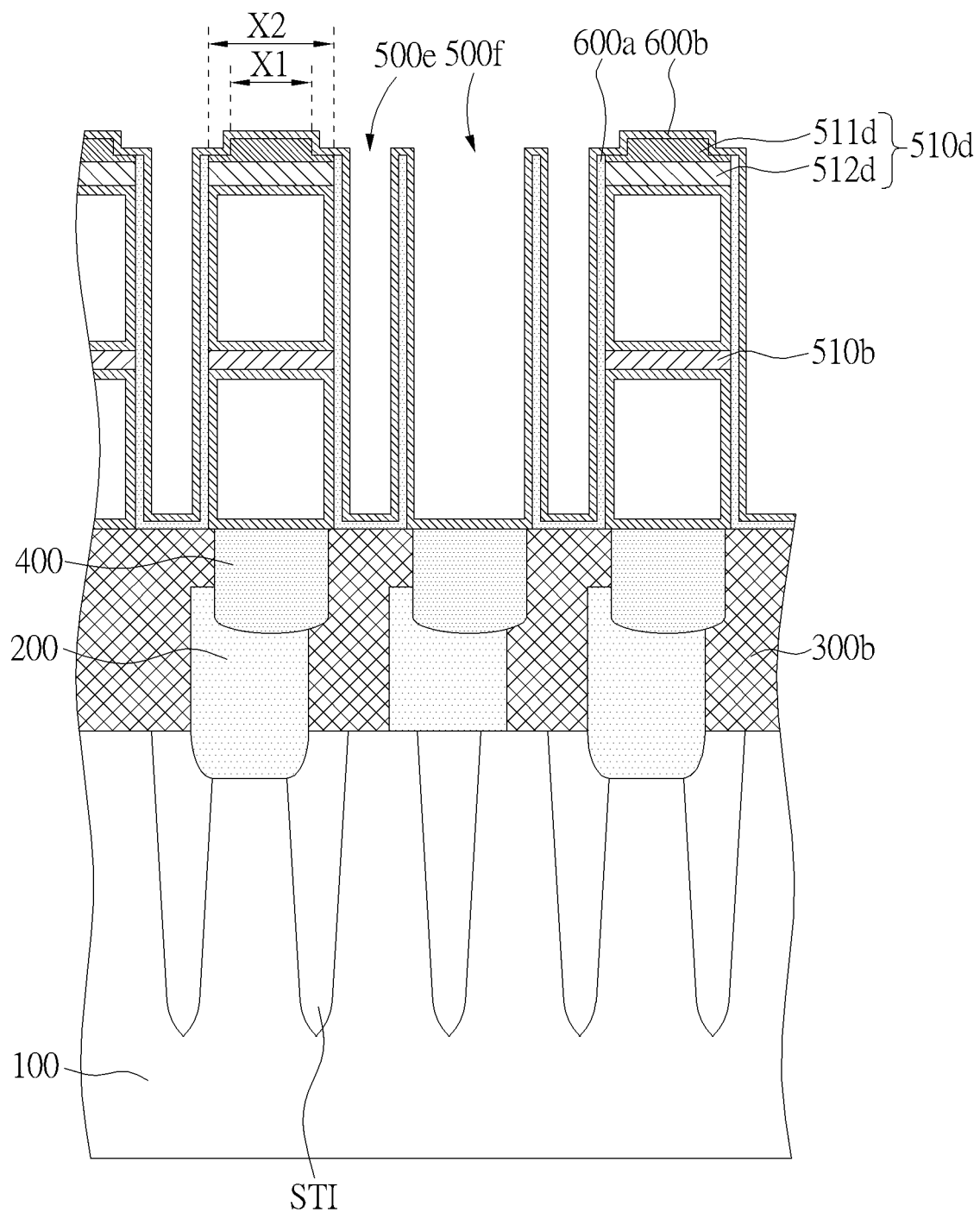
Figure 2K:
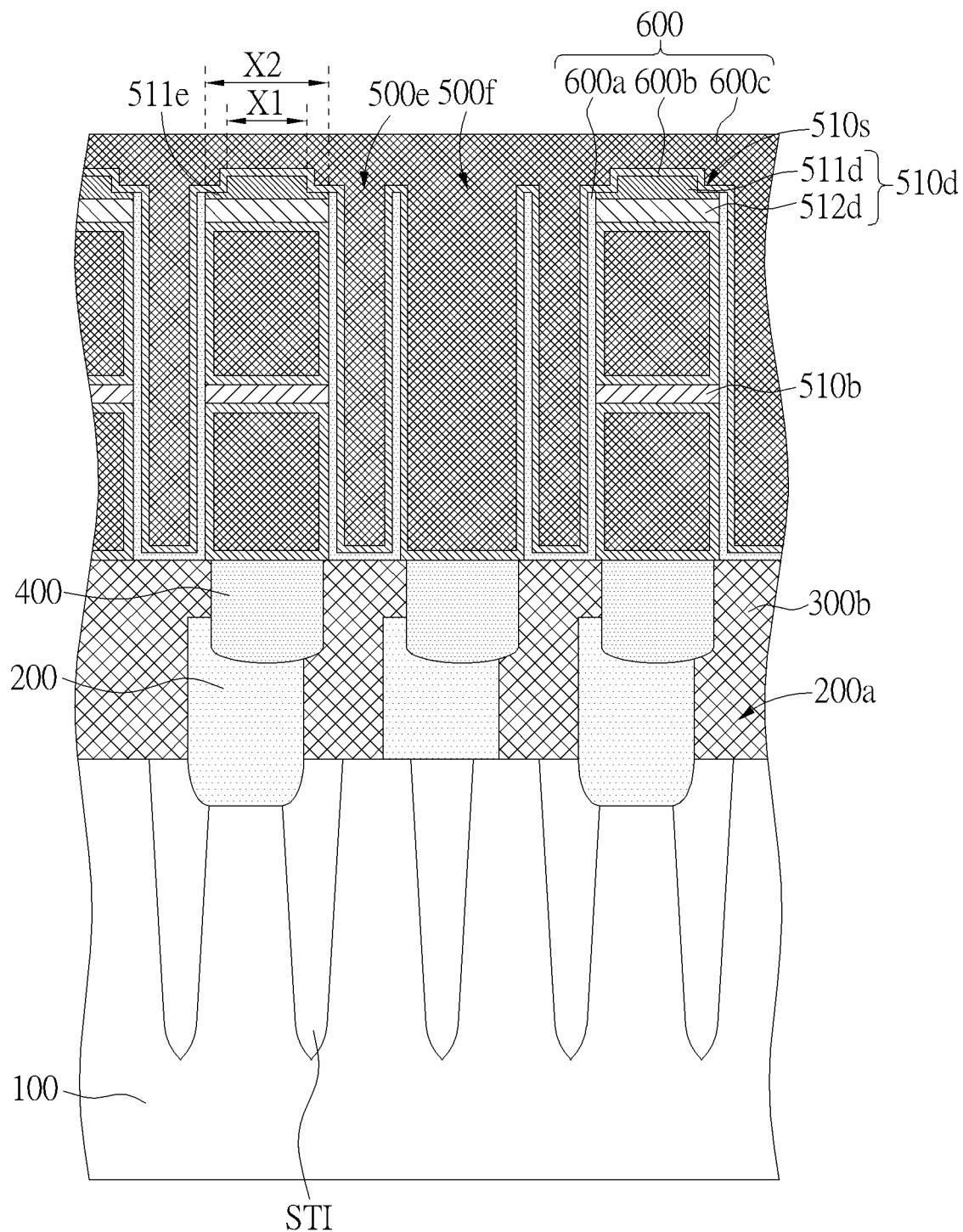

FIG. 2K is a schematic cross-sectional diagram of the memory device according to one embodiment of the disclosure. Referring to FIG. 2K, the memory device is, for example, a dynamic random access memory (DRAM), but not limited thereto. The memory device includes a substrate 100. The substrate 100 may include a silicon substrate, a silicon containing substrate, an epitaxial silicon substrate, or a silicon-on-insulator (SOI) substrate. The substrate 100 has a memory cell region and a periphery region. The drawings of the embodiments of the disclosure schematically show the memory cell region.

A number of shallow trench isolations STI are formed in the substrate 100 to define a plurality of active areas (not shown) in the substrate 100. The processes of forming the shallow trench isolation STI may include firstly forming a trench in the substrate 100 by etching, and then filling the trench with an insulating material (such as silicon oxide or silicon oxynitride), but not limited thereto. In addition, a plurality of buried gates (not shown) may be formed in the active area of the substrate 100. The buried gates extend parallel to each other in the same direction and cross the active area. The buried gates are used as the buried word lines (not shown) of the memory device.

Furthermore, the active area is used to form a transistor of a memory cell. A source/drain region may be formed in the active area, and the source/drain region includes a first source/drain region and a second source/drain region. The first source/drain region and the second source/drain region are located on two sides of the buried gate respectively to form the transistor of the memory cell. It should be understood that the bottoms of the first source/drain region and the second source/drain region are lower than the top of the buried gate, so that the first source/drain region and the second source/drain region have an overlapping area with the buried gate in the direction of the thickness of the substrate 100.

In addition, a plurality of bit line structures 200 may be formed on the substrate 100, which extend parallel to each other along another direction perpendicular to the buried gate, so as to cross both the active area and the buried gate in the substrate 100. The bit line structure 200 includes a first bit line conductive layer, a second bit line conductive layer, and a third bit line conductive layer that are stacked from bottom to top in sequence. The material of the first bit line conductive layer may include doped polysilicon, the material of the second bit line conductive layer may include titanium nitride, and the material of the third bit line conductive layer may include tungsten. Furthermore, the bit line structure 200 may further include a bit line shielding layer and isolation sidewall spacers. The bit line shielding layer is formed above the bit line conductive layers, and the isolation sidewall spacers cover at least the sidewalls of the bit line conductive layers and the sidewalls of the bit line shielding layer.

The bit line structure 200 may define a node contact window 200a, and the node contact window 200a is used to accommodate a node contact structure 300b. The bottom of at least a part of the node contact windows 200a may further extend into the substrate 100. The defined multiple node contact windows 200a are aligned and arranged in the extended directions of the bit line structure 200 and the buried gate. The multiple node contact windows 200a are arranged in an array, for example, to form an array of the node contact windows 200a. The multiple node contact windows 200a may be arranged in multiple rows and columns in the extended directions of the bit line structures 200 and the buried gates.

Still referring to FIG. 2K, the node contact structures 300b fill the node contact windows 200a and are arranged in multiple rows and columns accordingly. The node contact structure 300b is electrically connected to the corresponding active area.

In the embodiment, the node contact structure 300b fills the node contact window 200a, and the top of each node contact structure 300b is further higher than the top of the node contact window 200a. Moreover, in the embodiment, the node contact structure 300b is disposed on the substrate 100. In another embodiment of the disclosure, the node contact structure 300b may also extend into the active area of the substrate 100 and be electrically connected to the active area.

In an embodiment of the disclosure, the node contact structure 300b includes a conductive contact layer that fills the node contact window 200a to be electrically connected to the active area. In addition, the node contact structure 300b further includes an electrically conducting layer that fills the node contact window 200a and is formed on the conductive contact layer so as to be electrically connected to the conductive contact layer.

Still referring to FIG. 2K, the node contact structures 300b are separated by an isolation structure 400. In the embodiment, the isolation structure 400 extends from a position level with the top of the node contact structure 300b into the bit line structure 200, and a portion of the bit line shielding layer on the top of the bit line structure 200 is removed. In this way, the adjacent node contact structures 300b are electrically isolated from each other.

Still referring to FIG. 2K, in the embodiment, the isolation structure 400 is disposed on the bit line structure 200. In a direction perpendicular to the height, the position of the isolation structure 400 is not aligned with the bit line structure 200. The position of the isolation structure 400 is offset to the right by a certain distance relative to the bit line structure 200, so as to save area and reduce the size of the memory device. In other embodiments, in the direction perpendicular to the height, the position of the isolation structure 400 may be aligned with the position of the bit line structure 200, but not limited thereto.

In the embodiment, the node contact structure 300b includes an upper node contact portion and a lower node contact portion, the upper node contact portion is located above the level of the bottom of the isolation structure 400, and the lower node contact portion is located below the level of the bottom of the isolation structure 400. It may also be understood that the node contact structure 300b is divided into an upper node contact portion and a lower node contact portion with the level of the bottom of the isolation structure 400. In the direction perpendicular to the height, the maximum width of the upper node contact portion is greater than the maximum width of the lower node contact portion. The upper node contact portion has a larger width, thus the manufacturing difficulty of the node contact structure 300b is reduced.

Still referring to FIG. 2K, in the embodiment, the material of the isolation structure 400 is nitride, such as silicon nitride. In other embodiments, the isolation structure 400 may be a nitride doped with carbon (for example, carbon-doped silicon nitride), carbides (for example, silicon carbide), or oxides (for example, tantalum oxide or titanium oxide), but not limited thereto.

Referring to FIG. 2K, a first electrode 600a is formed on the node contact structure 300b. The bottom of the first electrode 600a is in contact with and electrically connected to the node contact structure 300b, and the first electrode 600a extends upwards to form a cylindrical structure. In the embodiment, each or at least one of the first electrodes 600a has a cylindrical shape with a closed bottom.

A first support layer 510d and a second support layer 510b are disposed on the sidewall of the first electrode 600a. The first support layer 510d is used to laterally support an upper portion of the sidewall of the first electrode 600a, and the second support layer 510b is used to laterally support a lower portion such as the middle portion of the sidewall of the first electrode 600a, thereby preventing the first electrode 600a from tilting. The first support layer 510d and the second support layer 510b are both patterned film layers. Alternatively, it may also be understood that a plurality of first openings 500e pass through the first support layer 510d and the second support layer 510b in sequence and then extend downwards. One of the first openings 500e is located above one of the node contact structures 300b, and the first opening 500e at least exposes a portion of the top of the node contact structure 300b. The first electrode 600a is disposed in the first opening 500e. The first support layer 510d and the second support layer 510b respectively laterally support the sidewalls of the first electrodes 600a. The second support layer 510b is spaced from the first support layer 510d in the direction of the height of the memory device.

Still referring to FIG. 2K, one sidewall of a part of the first electrodes 600a may not be supported by the first support layer 510d and the second support layer 510b. In the embodiment, the sidewalls of two adjacent first electrodes 600a are not supported by the first support layer 510d and the second support layer 510b. The two adjacent first electrodes 600a are separated by a second opening 500f.

It should be understood that in the embodiment, the second support layer 510b may enhance the supporting effect. In other embodiments, the second support layer 510b may be omitted, or additional support layers may be added to further improve the supporting effect, the examples are not described herein.

In the embodiment, the lateral width of the topmost surface of the first support layer 510d is smaller than the lateral width of the bottom thereof in the direction perpendicular to the sidewall of the first electrode 600a. As shown in FIG. 2K, the first support layer 510d has a slim portion 511e and a recessed sidewall 510s. Specifically, the first support layer 510d includes a first insulating layer 511d and a second insulating layer 512d. The first insulating layer 511d is disposed on the second insulating layer 512d. In the embodiment, the slim portion 511e of the first support layer 510d is located on the first insulating layer 511d. In the direction perpendicular to the sidewall of the first electrode 600a, the lateral width X1 of the topmost surface of the first insulating layer 511d is smaller than the lateral width X2 of the bottom thereof, and the lateral width X2 of the bottom of the first insulating layer 511d is equal to the lateral width of the second insulating layer 512d, so that the first support layer 510d has a narrow top and wide bottom structure as a whole.

Furthermore, the sidewall of the first insulating layer 511d has a step, so that the first insulating layer 511d has a convex shape as a whole. The lateral width X2 of the bottom of the first insulating layer 511d is equal to the lateral width of the second insulating layer 512d, so that the first support layer 510d also has a convex shape as a whole. In the embodiment, the recessed sidewall 510s of the first support layer 510d is an L-shaped sidewall.

In the embodiment, the material of the second insulating layer 512d is not doped with carbon, such as silicon oxide, silicon nitride, or silicon oxynitride not doped with carbon. The material of the second insulating layer 512d not doped with carbon has a high dielectric constant and good insulation effect, which reduces or avoids current leakage of the first electrode 600a. However, the material not doped with carbon has poor etching resistance. The second insulating layer 512d may be damaged in the etching step of the manufacturing process of the memory devices and thereby causing the supporting effect of the second insulating layer 512d is reduced. Accordingly, in the embodiment of the disclosure, the material of the first insulating layer 511d is a carbon-doped material, such as carbon-doped silicon nitride, carbon-doped silicon oxide or carbon-doped silicon oxynitride. Since the first insulating layer 511d is doped with carbon, the etching resistance of the first insulating layer 511d is enhanced, thereby preventing the second insulating layer 512d from being excessively damaged during the manufacturing process of the memory devices. As a result, it ensures and enhances the supporting effect of the first supporting layer 510d. Although the carbon-doped material may cause current leakage, the contact area between the first insulating layer 511d and the sidewall of the first electrode 600a is small due to the slim portion 511e of the first support layer 510d. Compared with the support layer all using carbon-doped material, the first support layer 510d of the embodiments of the disclosure reduces current leakage of the first electrode 600a, thereby improving the performance of the memory devices.

Furthermore, in the embodiments of the disclosure, the topmost surface of the first electrode 600a is higher than the top of the second insulating layer 512d and lower than the topmost surface of the first support layer 510d, i.e. lower than the topmost surface of the first insulating layer 511d, thereby decreasing the contact area of the first electrode 600a with the first insulating layer 511d. Therefore, the current leakage of the first electrode 600a is reduced.

In addition, a dielectric layer 600b such as a metal oxide layer conformally covers the surface of the first electrode 600a. The dielectric layer 600b may also conformally cover the exposed surfaces of the first insulating layer 511d, the second insulating layer 512d, and the second support layer 510b. The dielectric layer 600b also conformally covers the inner wall and the bottom of the second opening 500f.

Still referring to FIG. 2K, a second electrode 600c is formed on the dielectric layer 600b. The second electrode 600c covers at least a portion of the dielectric layer 600b, so that at least a portion of the second electrode 600c is faced with the first electrode 600a. In this way, the dielectric layer 600b is sandwiched between the first electrode 600a and the second electrode 600c. The second electrode 600c also extends to cover the top of the first insulating layer 511d and fills the first opening 500e and the second opening 500f. The first electrode 600a, the dielectric layer 600b, and the second electrode 600c together constitute a capacitor structure 600. The first electrode 600a and the second electrode 600c are used as a bottom electrode and a top electrode of the capacitor structure 600, respectively, and the dielectric layer 600b is used as the dielectric layer of the capacitor structure 600.

The method of fabricating the above-mentioned memory device in the embodiment will be described in detail below with reference to FIG. 1 and FIGS. 2A to 2K. In which, FIG. 1 is a flowchart illustrating a method of fabricating a memory device according to one embodiment of the disclosure, and FIGS. 2A to 2K are schematic cross-sectional diagrams of the structures of corresponding steps in the method of fabricating the memory device according to one embodiment of the disclosure.

Referring to FIG. 1, a method of fabricating a memory device includes:

Step S100: providing a substrate;

Step S200: forming a first electrode on the substrate and extending upwards;

Step S300: forming a first support layer laterally supporting an upper portion of a sidewall of the first electrode, where the first support layer has a slim portion;

Step S400: forming a dielectric layer on the first electrode and the first support layer; and Step S400: forming a second electrode on the dielectric layer.

Moreover, in the embodiment, at step S300, the top width of the first support layer is smaller than the bottom width of the first support layer in a direction perpendicular to the sidewall of the first electrode. The first support layer includes a first insulating layer doped with carbon and a second insulating layer not doped with carbon. The first insulating layer is disposed on the second insulating layer. At step S400, the dielectric layer may be a metal oxide layer and conformally covers the surfaces of the first electrode and the first support layer. At step S500, the second electrode is formed on at least a portion of the dielectric layer.

First, referring to FIG. 2A, step S100 is performed to provide a substrate 100. A trench isolation structure STI is formed in the substrate 100, and a number of active areas are defined by the trench isolation structure SIT. A number of buried gates (not shown) are also formed in the active areas as word lines, but not limited thereto. In some embodiments, other types of word line structure may also be formed as needed. In addition, the material of the electrode of the buried gates may include aluminum (Al), tungsten (W), copper (Cu), titanium aluminum alloy (TiAl) or other suitable conductive materials. The dielectric material for covering the electrode of the buried gates may include silicon nitride, silicon oxynitride, silicon carbide nitride or other suitable insulating materials.

Furthermore, a source/drain region is also formed in the active area of the substrate 100. The side edge boundary of the source/drain region extends to the sidewall of the buried gate near the top opening of the buried gate. The bottom boundary of the source/drain region is lower than the top of the buried gate, so that the source/drain region and the buried gate have overlapping regions that are faced with each other. The source/drain region includes a first source/drain region and a second source/drain region, and the first source/drain region and the second source/drain region are located at two sides of the buried gate respectively. In the embodiment, the side edge boundary of the first source/drain region also extends to the sidewall of the trench isolation structure STI.

It should be noted that the source and drain regions may be formed after the buried gates are formed, or the source and drain regions may be formed first, and then the buried gates are formed, which is not limited here.

A bit line structure 200 is formed on the substrate 100. The bit line structure 200 includes three conductive material layers stacked in sequence. Based on this, the bit line structure 200 may include a first bit line conductive layer, a second bit line conductive layer, and a third bit line conductive layer. Moreover, the bit line structure 200 further includes a bit line shielding layer. The bit line shielding layer may be a patterned film layer formed above the three conductive layers. In another embodiment, the patterned bit line shielding layer is used to pattern the conductive layers below it in sequence. In the embodiment, the method for forming the bit line structure 200 further includes: forming isolation spacers on the sidewalls of the first bit line conductive layer, the second bit line conductive layer, the third bit line conductive layer, and the bit line shielding layer.

As shown in FIG. 2A, a portion of the bit line structure 200 is located on the substrate 100, and a portion of the bit line structure 200 extends from the top of the substrate 100 into the active area of the substrate 100. The bit line structure 200 defines a number of node contact windows 200a on the substrate 100.

Referring to FIG. 2B, a conductive material layer 300 is formed on the substrate 100. The conductive material layer 300 fills up and covers the node contact windows 200a and extends to cover the top of the bit line structure 200. The conductive material layer 300 is used to form a node contact structure, and its material may include silicon-containing conductive materials such as amorphous silicon, polysilicon, and other conductive materials such as metal conductive materials. For example, the lower portion of the conductive material layer 300 may be a silicon-containing conductive material, and the upper portion of the conductive material layer 300 may be a metal conductive material with low resistivity, such as tungsten, but not limited thereto. In addition, a metal silicide layer may be formed between the lower and upper portions of the conductive material layer 300 to reduce the contact resistance between the silicon-containing conductive material and the metal conductive material, but not limited thereto.

Referring to FIG. 2B and FIG. 2C, the conductive material layer 300 and at least a portion of the bit line structure 200 are etched to form a number of grooves 300a. The grooves 300a correspond to the bit line structures 200 respectively. As shown in FIG. 2C, the groove 300a separates the remaining conductive material layers 300, and the remaining conductive material layers 300 may form a number of node contact structures 300b. The node contact structures 300b are electrically isolated from each other.

In the embodiment, the node contact windows 200a are disposed on the substrate 100, so that the formed node contact structures 300b are also disposed on the substrate 100. In another embodiment, before forming the conductive material layer 300, the bottom of the node contact window 200a may be etched so that the node contact window 200a extends into the active area of the substrate 100. As a result, the node contact structure 300b may extend from the top of the substrate 100 into the active area and be electrically connected to the active area.

Still referring to FIG. 2C, in the embodiment, the position of the groove 300a is offset (offset to the right) from the bit line structure 200 in the direction perpendicular to the height of the memory device (that is perpendicular to the thickness direction of the substrate 100). Therefore, the process window of the groove 300a is widened, and it is beneficial to save the area of the groove 300a. In another embodiment, the position of the groove 300a may be directly above the bit line structure 200, but not limited thereto.

Still referring to FIG. 2C, the node contact structure 300b may be divided into an upper node contact portion and a lower node contact portion with the level of the bottom of the groove 300a. In the direction perpendicular to the height of the memory device, the maximum width of the upper node contact portion may be greater than the maximum width of the lower node contact portion. By increasing the width of the node contact structure 300b near the top of the groove 300a, the manufacturing difficulty of the node contact structure 300b is reduced.

Referring to FIG. 2D, an isolation structure 400 is formed in the groove 300a. The isolation structure 400 fills up the groove 300a to isolate the adjacent node contact structures 300b.

In the embodiment, the material of the isolation structure 400 is silicon nitride. In another embodiment, the material of the isolation structure 400 may be carbon-doped nitrides (for example, carbon-doped silicon nitride) or carbides (for example, silicon carbide), but not limited thereto.

Referring to FIG. 2E, step S200 and step S300 are performed. A second sacrificial material layer 500a, a second support material layer 500b, a first sacrificial material layer 500c, and a first support material layer 500d are formed on the isolation structures 400 and the node contact structures 300b from bottom to top in sequence. The second sacrificial material layer 500a, the second support material layer 500b, the first sacrificial material layer 500c, and the first support material layer 500d are stacked to form a stacked material layer 500. The first sacrificial material layer 500c and the second sacrificial material layer 500a constitute a sacrificial material layer. In one embodiment, the thickness of the first support material layer 500d is greater than the thickness of the second support material layer 500b, so as to avoid the thickness of the second support material layer 500b affecting the size of the area where the capacitor structure is formed. Meanwhile, the thicker first support material layer 500d ensures its supporting effect.

Still referring to FIG. 2E, the first support material layer 500d includes a first insulating material layer 501d and a second insulating material layer 502d. The first insulating material layer 501d is disposed on the second insulating material layer 502d. The material of the first insulating material layer 501d is a carbon-doped insulating material, such as carbon-doped silicon nitride (SiCN), carbon-doped silicon oxide (SiOC), carbon-doped silicon oxynitride (SiCON), or a combination thereof. The material of the second insulating material layer 502d is an insulating material not doped with carbon, such as silicon nitride, silicon oxide, silicon oxynitride, or a combination thereof. In addition, the second sacrificial material layer 500a and the first sacrificial material layer 500c may respectively include a single layer or multiple layers of oxide materials, such as silicon oxide, tetraethyl orthosilicate (TEOS), boro-phospho-silicate-glass (BPSG), or a combination thereof. The second support material layer 500b may include a single layer or multiple layers of materials, such as nitride (for example, silicon nitride), oxide (for example, silicon oxide), or a combination thereof, but not limited thereto.

In some embodiments, only the first sacrificial material layer 500c and the first support material layer 500d are formed, and the second sacrificial material layer 500a and the second support material layer 500b are not formed.

Referring to FIG. 2F, a patterned mask layer (not shown) may be used in an etching process to pattern the stacked material layer 500. Specifically, using the patterned mask layer as a mask, the first support material layer 500d, the first sacrificial material layer 500c, the second support material layer 500b, and the second sacrificial material layer 500a are etched in sequence to form a number of first openings 500e. The position of one of the first openings 500e corresponds with the position of one of the node contact structures 300b. The first opening 500e exposes at least a portion of the top of the node contact structure 300b.

Still referring to FIG. 2F, in the embodiment, the width of the first opening 500e is smaller than the maximum width of the upper node contact portion in the direction perpendicular to the height of the memory device, so that the first opening 500e may expose a portion of the top of the node contact structure 300b. In another embodiment, the width of the first opening 500e may be greater than or equal to the maximum width of the upper node contact portion.

In addition, the method of fabricating the memory device further includes the following steps.

Referring to FIG. 2F and FIG. 2G, after the first opening 500e is formed, the patterned mask layer is removed, and a first electrode 600a is formed in the first opening 500e. The first electrode 600a covers the inner wall of the first opening 500e and is electrically connected to the corresponding node contact structure 300b. As shown in FIG. 2G, the first support material layer 500d, the first sacrificial material layer 500c, the second support material layer 500b, and the second sacrificial material layer 500a are all located on the sidewalls of the first electrode 600a. In the embodiment, when the first electrode 600a is formed, over-etching or over-polishing may be performed, so that the topmost surface of the first electrode 600a is lower than the topmost surface of the first insulating material layer 501d, but not be lower too much. Thus, the topmost surface of the first electrode 600a is higher than the topmost surface of the second insulating material layer 502d.

Referring to FIG. 2H, the first support material layer 500d is patterned using a patterned mask layer to form a number of second openings 500f in the first support material layer 500d (only one second opening 500f is schematically shown). The planar shape of the second opening 500f may be a triangle or a rhombus. The second opening 500f defines the area of the second support material layer 500b to be removed later. It should be noted that the different shape of the second opening 500f or the different arrangement of the second opening 500f will affect the strength of the second support material layer 500b and the first support material layer 500d to support the first electrode 600a and the efficiency of removing the second sacrificial material layer 500a and the first sacrificial material layer 500c. Therefore, by adjusting the shape of the second opening 500f and the arrangement of the second opening 500f, a stronger effect of supporting the first electrode 600a and a higher efficiency of removing the sacrificial material layers are achieved.

Next, referring to FIG. 2H and FIG. 2I, the first sacrificial material layer 500c at the bottom of the second opening 500f is etched, so that the second opening 500f extends downwards and exposes a portion of the second support material layer 500b. The etching process used in this step may be an isotropic etching process such as a wet etching process, so that the first sacrificial material layer 500c may be completely removed, i.e., the portion of the first sacrificial material layer 500c covered by the first support material layer 500d may be also removed, but not limited thereto.

Still referring to FIG. 2H and FIG. 2I, next, the second support material layer 500b at the bottom of the second opening 500f is removed by an etching process, so that the second support material layer 500b is patterned, and the second opening 500f further extends downwards to expose the second sacrificial material layer 500a. The etching process in this step is an anisotropic etching process, such as a dry etching process, so that only the portion of the second support material layer 500b at the bottom of the second opening 500f is removed, and the other portion of the second support material layer 500b covered by the first support material layer 500d remains. It should be understood that since the lateral etching of the anisotropic etching process is relatively inconspicuous, a protruding structure similar to a waistband will be left on the sidewall of the first electrode 600a.

Then, an etching process is used to completely remove the second sacrificial material layer 500a under the second opening 500f, so that the second opening 500f extends to the isolation structure 400, and the second opening 500f exposes the sidewalls of the first electrode 600a. The etching process used in this step may be an isotropic etching process, such as a wet etching process, so that the second sacrificial material layer 500a may be completely removed, i.e., the portion of the second sacrificial material layer 500a covered by the first support material layer 500d and the second support material layer 500b may be also removed, but not limited thereto.

In some embodiments, the second support material layer 500b, the second sacrificial material layer 500a, the first support material layer 500d, and the first sacrificial material layer 500c may be etched continuously through a single etching step. Alternatively, the second support material layer 500b, the second sacrificial material layer 500a, the first support material layer 500d, and the first sacrificial material layer 500c may be respectively etched by the etching steps including multiple different process conditions as required. For example, when the second support material layer 500b and the first support material layer 500d are nitride layers, a plasma etching process may be used to etch the second support material layer 500b and the first support material layer 500d. The reaction gases used in the plasma etching process may include oxygen, nitrogen, hydrogen, nitrogen trifluoride (NF$_3$), carbon tetrafluoride (CF$_4$), sulfur hexafluoride (SF$_6$), methane (CH$_4$), or a combination thereof, but not limited thereto. The etching selectivity of the plasma etching process to different materials may be controlled by adjusting the composition ratio of the above-mentioned reaction gases. For example, in some embodiments, the etching rate of the plasma etching process for the second support material layer 500b and the first support material layer 500d may be greater than the etching rate of the second sacrificial material layer 500a and the first sacrificial material layer 500c, but not limited thereto. In addition, the etching steps performed on the second sacrificial material layer 500a and the first sacrificial material layer 500c may also have a higher etching selectivity to the second support material layer 500b and the first support material layer 500d, thereby improving the control ability of the etching process for the formed pattern.

Still referring to FIG. 2H and FIG. 2I, since the first insulating material layer 501d is disposed at the top surface, while the second sacrificial material layer 500a and the first sacrificial material layer 500c are etched, a portion of the first insulating material layer 501d is also etched. In particular, the topmost surface of the first electrode 600a is lower than the topmost surface of the first insulating material layer 501d, and the portion of the sidewalls of the first insulating material layer 501d not covered by the first electrode 600a will be etched laterally, so that the top width of the first insulating material layer 501d is smaller than the bottom width thereof. After the etching is completed, the remaining second supporting material layer 500b constitutes the second support layer 510b, the remaining first insulating material layer 501d constitutes the first insulating layer 511d, and the remaining second insulating material layer 502d constitutes the second insulating layer 512d. The first insulating layer 511d and the second insulating layer 512d constitute the first support layer 510d. The first support layer 510d has a slim portion 511e and a recessed sidewall 510s. The first support layer 510d and the second support layer 510b are used to support the top region and the middle region of the first electrode 600a respectively. When the height of the first electrode 600a is large, the first support layer 510d and the second support layer 510b support the first electrode 600a and prevent the first electrode 600a from tilting. Referring to FIG. 2J, step S400 is performed to form a dielectric layer 600b such as a metal oxide layer on the substrate 100. The dielectric layer 600b may conformally cover the exposed surfaces of the first electrode 600a, the first support layer 510d and the second support layer 510b.

Referring to FIG. 2K, step S500 is performed to form a second electrode 600c on the dielectric layer 600b. The second electrode 600c may cover a portion of the upper surface of the dielectric layer 600b and fills up the first openings 500e and the second openings 500f, but not limited thereto. At least a portion of the dielectric layer 600b is located between the first electrode 600a and the second electrode 600c to constitute a capacitor structure 600, and a portion of the capacitor structure 600 may be located on the node contact structures 300b, but not limited thereto. In some embodiments, the first electrode 600a and the second electrode 600c may be regarded as the bottom electrode and the top electrode of the capacitor structure 600, but not limited thereto.

It should be understood that the material of the first electrode 600a may include impurity-doped silicon, metals such as tungsten or copper, and/or conductive metal compounds such as titanium nitride. The material of the second electrode 600c may include impurity-doped silicon, Ru, RuO, Pt, PtO, Ir, IrO, SRO(SrRuO), BSRO((Ba,Sr)RuO), CRO(CaRuO), BaRuO, La(Sr,Co)O, Ti, TiN, W, WN, Ta, TaN, TiAlN, TiSiN, TaAlN, TaSiN, or a combination thereof, but not limited thereto. The dielectric layer 600b may be any suitable high dielectric constant metal oxide layer, such as TaO, TaAlO, TaON, AlO, AlSiO, HfO, HfSiO, ZrO, ZrSiO, TiO, TiAlO, BST((Ba, Sr)TiO), STO(SrTiO), BTO(BaTiO), PZT(Pb(Zr,Ti)O), (Pb,La)(Zr,Ti)O, Ba(Zr,Ti)O, Sr(Zr,Ti)O or a combination thereof.

Figure 3:
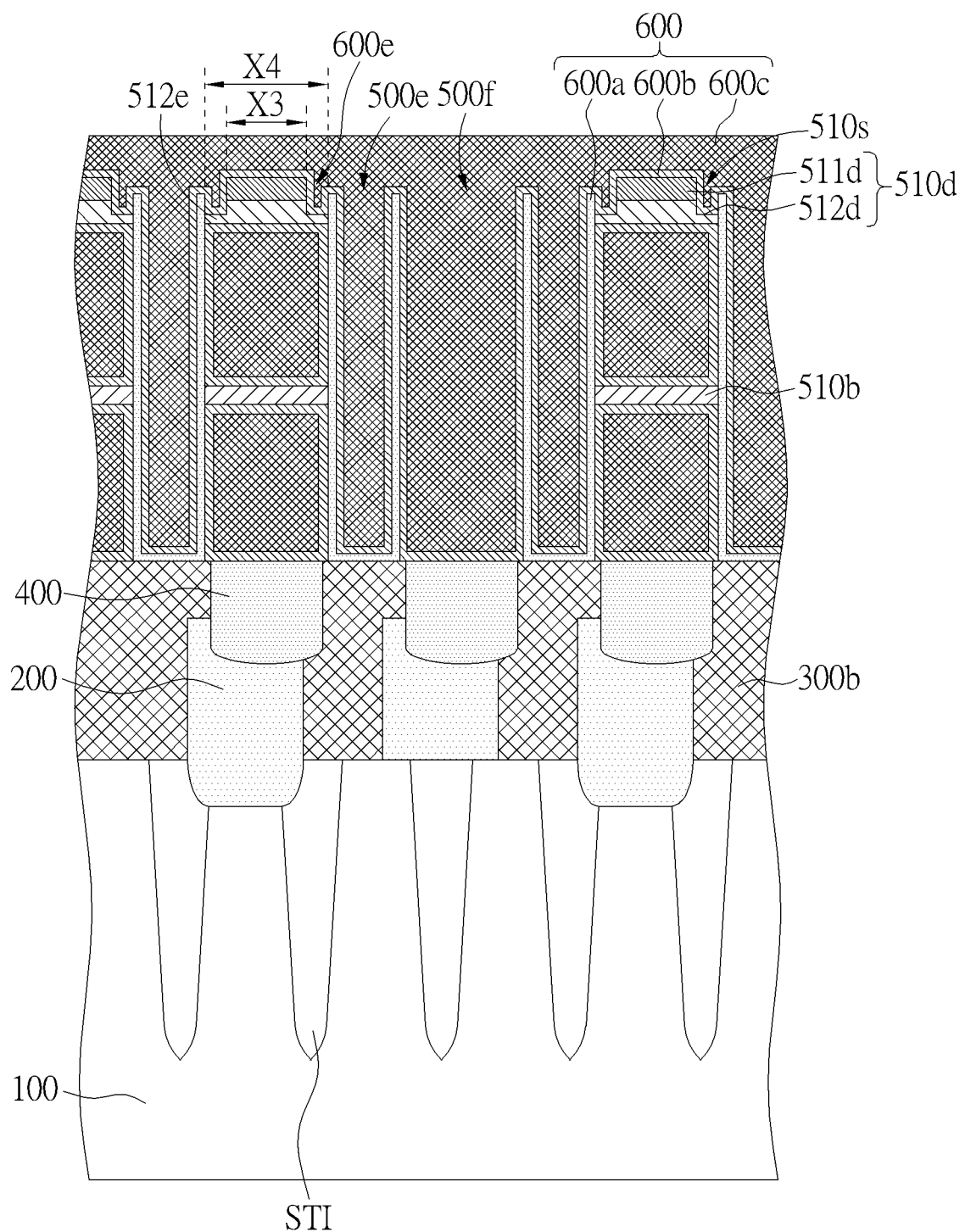
FIG. 3 is a schematic cross-sectional diagram of a memory device according to another embodiment of the disclosure.

FIG. 3 is a schematic cross-sectional diagram of a memory device according to another embodiment of the disclosure. As shown in FIG. 3, the difference between the embodiments of FIG. 3 and FIG. 2K is that the first support layer 510d of the embodiment of FIG. 3 has a slim portion 512e on the second insulating layer 512d. In addition, for the first support layer 510d of the embodiment of FIG. 3, the lateral width of the first insulating layer 511d is equal to the lateral width X3 of the topmost surface of the second insulating layer 512d. The lateral width X3 of the topmost surface of the second insulating layer 512d is smaller than the lateral width X4 of the bottom of the second insulating layer 512d. Thus, the first support layer 510d has a narrow top and a wide bottom structure as a whole.

Furthermore, the first support layer 510d of the embodiment of FIG. 3 has a recessed sidewall 510s. The recessed sidewall 510s of the first support layer 510d may be an L-shaped sidewall. The sidewalls of the second insulating layer 512d have steps, so that the second insulating layer 512d has a convex shape as a whole. Since the lateral width of the first insulating layer 511d is equal to the lateral width X3 of the topmost surface of the second insulating layer 512d, the first support layer 510d also has a convex shape as a whole.

Since the first support layer 510d has a convex shape as a whole, there is a gap between the sidewall of the first support layer 510d and the sidewall of the first electrode 600a. The dielectric layer 600b may conformally cover the inner wall of the gap, so that there is also a gap 600e between the portions of the dielectric layer 600b on the inner wall of the gap between the sidewalls of the first support layer 510d and the first electrode 600a. In addition, the second electrode 600c may be disposed in the gap 600e or fills up the gap 600e.

The method of fabricating the memory device of the embodiment of FIG. 3 may be similar to the method of fabricating the memory device of the embodiment of FIG. 2K. The difference is that in the embodiment of FIG. 3, when the sacrificial material layer is removed by etching, the removed portion of the first insulating material layer is more than that of the embodiment of FIG. 2K. As a result, a portion of the second insulating material layer is also etched. Although the support of the first support layer 510d is slightly reduced, the area of the first electrode 600a facing the second electrode 600c is increased. Therefore, the capacity of the capacitor structure 600 is increased.

Figure 4:
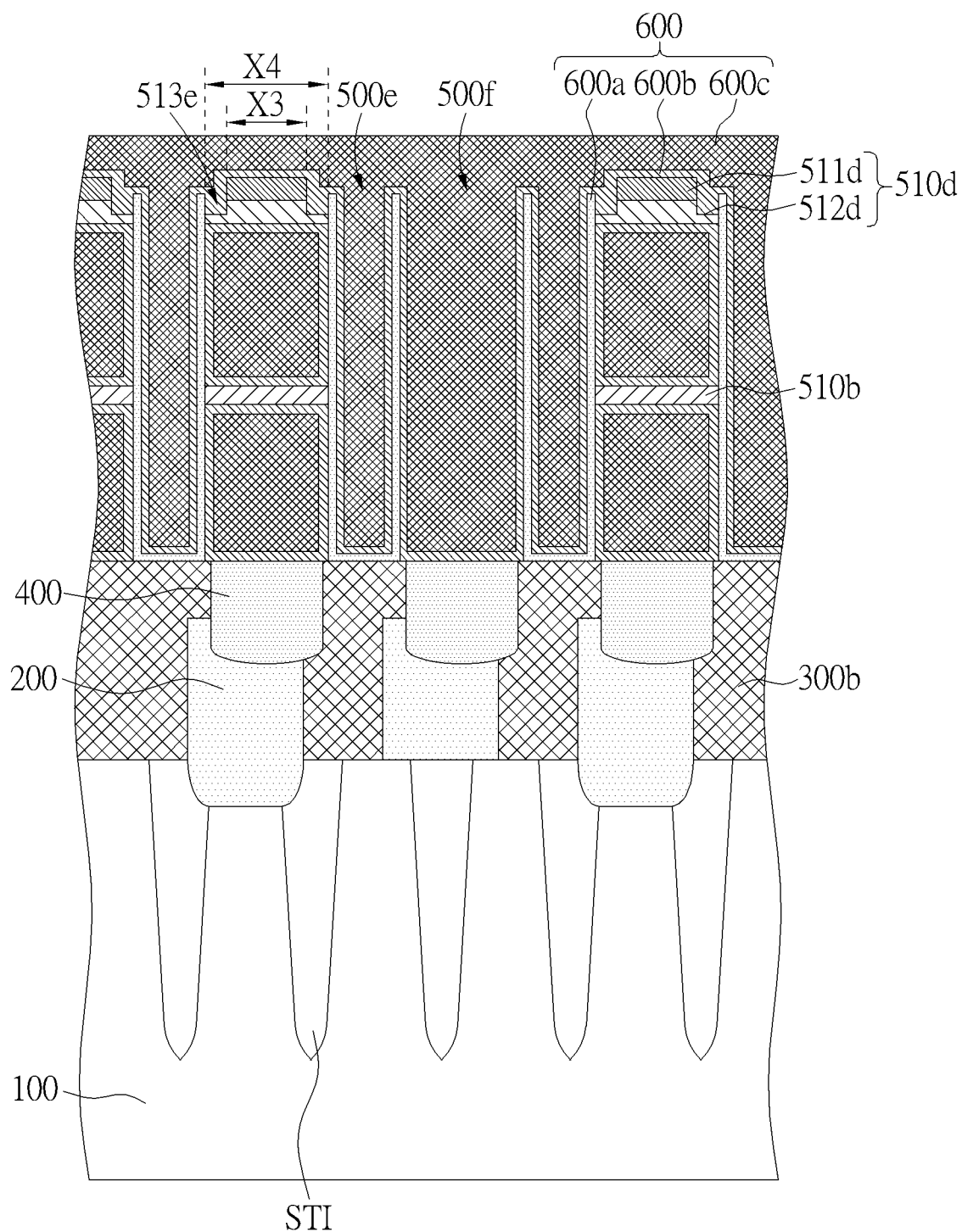
FIG. 4 is a schematic cross-sectional diagram of a memory device according to another embodiment of the disclosure.

FIG. 4 is a schematic cross-sectional diagram of a memory device according to another embodiment of the disclosure. As shown in FIG. 4, the difference between the embodiments of FIG. 4 and FIG. 3 is that the dielectric layer 600b fills up the gap 513e between the sidewall of the first support layer 510d and the sidewall of the first electrode 600a.

The method of fabricating the memory device of the embodiment of FIG. 4 may be similar to the method of fabricating the memory device of the embodiment of FIG. 3. The difference is that in the embodiment of FIG. 4, a good trench filling film deposition process is used to form the dielectric layer 600b, so that the dielectric layer 600b fills up the gap 513e. In this way, the dielectric layer 600b also supports the first electrode 600a, and further prevents the first electrode 600a from tilting.

Figure 5:
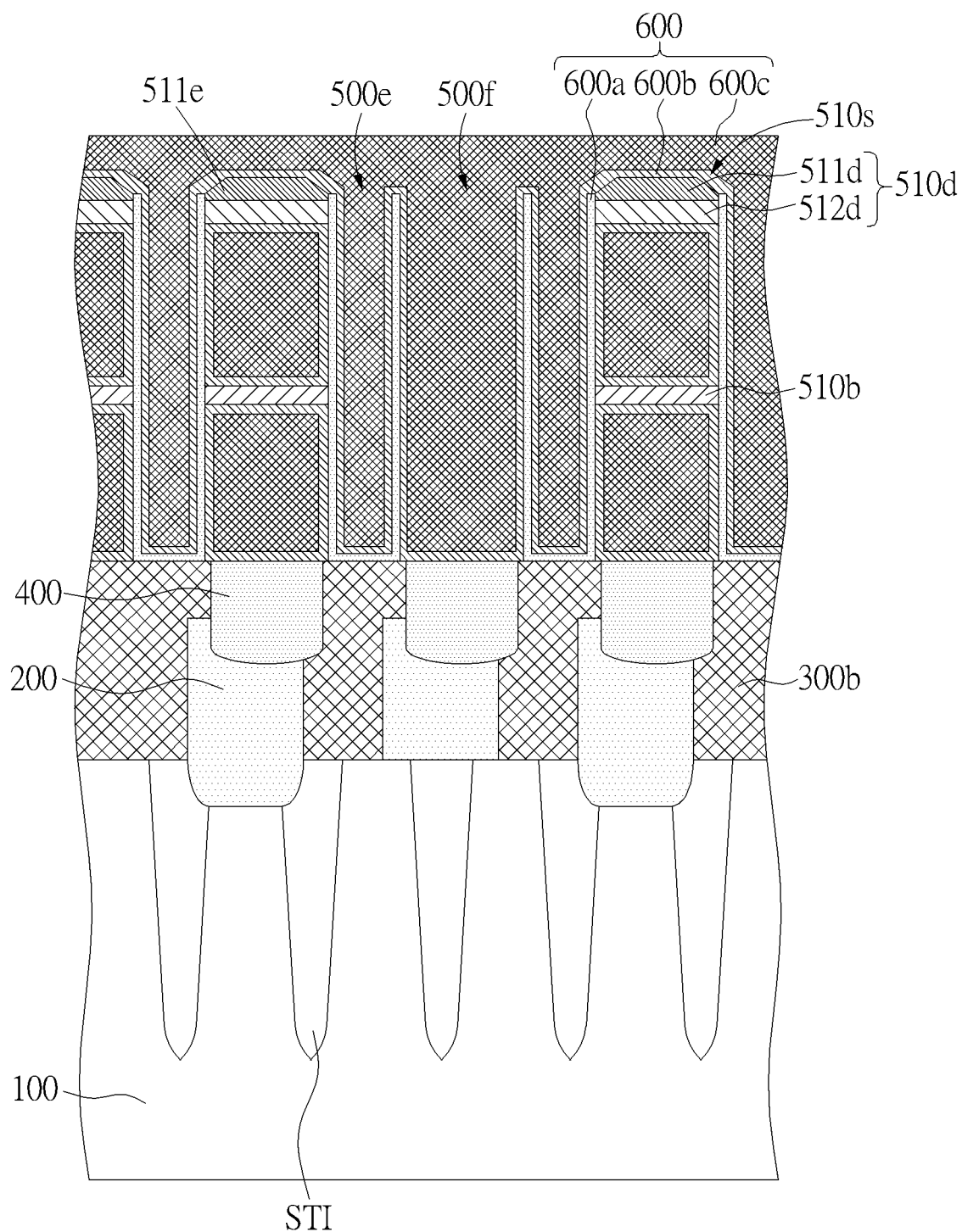
FIG. 5 is a schematic cross-sectional diagram of a memory device according to another embodiment of the disclosure.

FIG. 5 is a schematic cross-sectional diagram of a memory device according to another embodiment of the disclosure. As shown in FIG. 5, the difference between the embodiments of FIG. 5 and FIG. 2K is that in the embodiment of FIG. 5, the lateral widths of the first insulating layer 511d are gradually decreased in a direction from the bottom to the top of the first insulating layer 511d. As a result, the first insulating layer 511d has a trapezoidal shape as a whole. The first support layer 510d still has a narrow top and a wide bottom structure as a whole. The first support layer 510d also has a slim portion 511e and a recessed sidewall 510s. In the embodiment, the recessed sidewall 510s of the first support layer 510d is an inclined sidewall. The slim portion 511e of the first support layer 510d may be a triangle.

In some embodiments, the first insulating layer 511d is not limited to being trapezoidal, and may have other irregular shapes. For example, the sidewalls of the first insulating layer 511d may be arc-shaped, zigzag-shaped, etc.

The method of fabricating the memory device of the embodiment of FIG. 5 may be similar to the method of fabricating the memory device of the embodiment of FIG. 2K. The difference is that in the embodiment of FIG. 5, when the sacrificial material layer is removed by etching, the first insulating layer 511d is etched to form a shape that gradually shrinks in the direction from the bottom to the top thereof.

In summary, in the embodiments of the memory devices and the methods of fabricating the memory devices provided by the present disclosure, the first support layer laterally supports the upper portion of the sidewall of the first electrode. The first support layer includes a first insulating layer doped with carbon and a second insulating layer not doped with carbon. The first insulating layer is disposed on the second insulating layer, and the carbon-doped first insulating layer has good etching resistance to reduce the degree of damage of the first support layer being etched by other etching processes during the fabrication of the memory devices. As a result, only the top of the first support layer is slightly damaged, and the bottom of the first support layer is intact, which ensures the supporting effect of the first support layer. Although the carbon-doped first insulating layer may cause current leakage of the first electrode of the capacitor structure, the second insulating layer is not doped with carbon and reduces the current leakage of the first electrode. Moreover, in some embodiments of the disclosure, only the slim portion of the first insulating layer is in contact with the first electrode. In some embodiments of the disclosure, the first insulating layer is not in contact with the first electrode. The first support layer of the embodiments of the disclosure enhances the supporting effect for the first electrode and also reduces the current leakage of the first electrode, thereby improving the performance of the memory devices.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory device, comprising:
   a first electrode, disposed on a substrate and extending upwards;
   a first support layer, laterally supporting an upper portion of a sidewall of the first electrode, wherein the first support layer has a slim portion and a recessed sidewall located on the slim portion;
   a dielectric layer, disposed on the first electrode and the first support layer, and in direct contact with the recessed sidewall; and
   a second electrode, disposed on the dielectric layer.

2. The memory device of claim 1, wherein a top width of the first support layer is smaller than a bottom width of the first support layer in a direction perpendicular to the sidewall of the first electrode.

3. The memory device of claim 1, wherein a topmost surface of the first electrode is lower than a topmost surface of the first support layer.

4. The memory device of claim 1, wherein the first support layer comprises a first insulating layer and a second insulating layer, and the first insulating layer is disposed on the second insulating layer.

5. The memory device of claim 4, wherein a topmost surface of the first electrode is higher than a topmost surface of the second insulating layer.

6. The memory device of claim 4, wherein the slim portion of the first support layer is located on the first insulating layer, and a top width of the first insulating layer is smaller than a bottom width of the first insulating layer in a direction perpendicular to the sidewall of the first electrode.

7. The memory device of claim 4, wherein the slim portion of the first support layer is located on the second insulating layer, and a top width of the second insulating layer is smaller than a bottom width of the second insulating layer in a direction perpendicular to the sidewall of the first electrode.

8. The memory device of claim 4, wherein a width of the first insulating layer is equal to a top width of the second insulating layer in a direction perpendicular to the sidewall of the first electrode.

9. The memory device of claim 4, wherein widths of the first insulating layer are gradually decreased in a direction from the bottom to the top of the first insulating layer.

10. The memory device of claim 4, wherein the first insulating layer is doped with carbon, and the second insulating layer is not doped with carbon.

11. The memory device of claim 4, wherein the material of the first insulating layer comprises a carbon-doped silicon nitride, a carbon-doped silicon oxide or a carbon-doped silicon oxynitride.

12. The memory device of claim 1, wherein there is a gap between the dielectric layer, and the second electrode is disposed in the gap or fills up the gap.

13. The memory device of claim 1, wherein the first support layer has an L-shaped sidewall or an inclined sidewall.

14. The memory device of claim 1, wherein there is a gap between the first electrode and the first support layer, and the dielectric layer is disposed in the gap or fills up the gap.

15. The memory device of claim 1, further comprising a second support layer laterally supporting a lower portion of the sidewall of the first electrode and spaced from the first support layer, wherein the dielectric layer is disposed on the second support layer.

16. A method of fabricating a memory device, comprising:
    forming a first electrode on a substrate and extending upwards;
    forming a first support layer laterally supporting an upper portion of a sidewall of the first electrode, wherein the first support layer has a slim portion and a recessed sidewall located on the slim portion;
    forming a dielectric layer on the first electrode and the first support layer, and in direct contact with the recessed sidewall; and
    forming a second electrode on the dielectric layer.

17. The method of fabricating the memory device of claim 16, wherein forming the first electrode and forming the first support layer comprise:
    forming a sacrificial material layer and a first support material layer on the substrate in sequence, wherein the first support material layer comprises a first insulating material layer that is doped with carbon and a second insulating material layer that is not doped with carbon, and the first insulating material layer is formed on the second insulating material layer;
    etching the first support material layer and the sacrificial material layer to form a plurality of first openings to expose the substrate;
    forming the first electrode in the plurality of first openings;
    etching the first support material layer to form a plurality of second openings to expose the sacrificial material layer; and
    removing the sacrificial material layer through the plurality of second openings and etching a portion of the first support material layer in an etching process to form the first support layer, wherein a top width of the first support layer is smaller than a bottom width of the first support layer in a direction perpendicular to the sidewall of the first electrode.

18. The method of fabricating the memory device of claim 17, wherein etching the portion of the first support material layer comprises:
    etching a portion of the first insulating material layer to form the slim portion of the first support layer, wherein a top width of the remaining first insulating material layer is smaller than a bottom width of the remaining first insulating material layer in a direction perpendicular to the sidewall of the first electrode.

19. The method of fabricating the memory device of claim 17, wherein etching the portion of the first support material layer comprises:
    etching a portion of the first insulating material layer and a portion of the second insulating material layer to form the slim portion of the first support layer, wherein a top width of the remaining second insulating material layer is smaller than a bottom width of the remaining second insulating material layer, and a width of the remaining first insulating material layer is equal to the top width of the remaining second insulating material layer in a direction perpendicular to the sidewall of the first electrode.

20. The method of fabricating the memory device of claim 17, wherein the sacrificial material layer comprises a first sacrificial material layer and a second sacrificial material layer, and the first sacrificial material layer is formed above the second sacrificial material layer, and further comprising:
    forming a second support layer between the first sacrificial material layer and the second sacrificial material layer, wherein after the sacrificial material layer is removed, the second support layer is spaced from the first support layer and laterally supports a lower portion of the sidewall of the first electrode, and the dielectric layer is formed on the second support layer.

* * * * *